(12) United States Patent
Lopatin et al.

(10) Patent No.: US 6,538,327 B1
(45) Date of Patent: Mar. 25, 2003

(54) METHOD OF COPPER INTERCONNECT FORMATION USING ATOMIC LAYER COPPER DEPOSITION AND A DEVICE THEREBY FORMED

(75) Inventors: Sergey D. Lopatin, Santa Clara, CA (US); Carl Galewski, Aromas, CA (US); Takeshi T. N. Nogami, Atsugi (JP)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/052,831

(22) Filed: Jan. 15, 2002

Related U.S. Application Data

(62) Division of application No. 09/627,352, filed on Jul. 28, 2000, now Pat. No. 6,368,954.

(51) Int. Cl.[7] .................................................. H01L 29/40
(52) U.S. Cl. ........................ 257/758; 257/752; 257/750
(58) Field of Search ................................. 257/752, 750, 257/751, 758; 438/628, 643, 653, 927, 626, 631, 645

(56) References Cited

U.S. PATENT DOCUMENTS

| | | | | |
|---|---|---|---|---|
| 5,278,448 A | * | 1/1994 | Fujii ........................... | 257/750 |
| 6,130,161 A | * | 10/2000 | Ashley et al. .............. | 438/687 |
| 6,157,081 A | * | 12/2000 | Nariman et al. ............ | 257/752 |
| 6,291,082 B1 | * | 9/2001 | Lopatin ....................... | 428/621 |
| 6,323,135 B1 | * | 11/2001 | Ngo et al. ................... | 438/740 |
| 6,331,484 B1 | * | 12/2001 | Bhowmilk et al. ......... | 438/648 |
| 6,168,704 B1 | * | 1/2002 | Brown et al. ............... | 205/118 |
| 6,177,347 B1 | * | 1/2002 | Liu et al. .................... | 438/675 |
| 6,181,012 B1 | * | 1/2002 | Edelstein et al. ........... | 257/762 |
| 6,184,137 B1 | * | 2/2002 | Ding et al. ................. | 438/687 |
| 6,242,808 B1 | * | 6/2002 | Shimizu et al. ............ | 257/762 |
| 6,249,055 B1 | * | 6/2002 | Dubin ......................... | 257/758 |
| 6,255,731 B1 | * | 7/2002 | Ohmi et al. ................ | 257/758 |

* cited by examiner

*Primary Examiner*—Jasmine J B Clark
(74) *Attorney, Agent, or Firm*—LaRiviere, Grubman & Payne, LLP

(57) ABSTRACT

A method for fabricating a semiconductor interconnect structure having a substrate with an interconnect structure patterned therein, a barrier layer, a pre-seed layer, a seed layer, a bulk interconnect layer, and a sealing layer, and a device thereby formed. The barrier layer is formed using atomic layer deposition techniques. Subsequently, a pre-seed layer is formed to create a heteroepitaxial interface between the barrier and pre-seed layers. This is accomplished using atomic layer epitaxy techniques to form the pre-seed layer. Thereafter, a seed layer is formed by standard deposition techniques to create a homoepitaxial interface between the seed and pre-seed layers. Upon this layered structure further bulk deposition of conducting materials is done. Excess material is removed from the bulk layer and a sealing layer is formed on top to complete the interconnect structure.

13 Claims, 6 Drawing Sheets

US 6,538,327 B1

METHOD OF COPPER INTERCONNECT FORMATION USING ATOMIC LAYER COPPER DEPOSITION AND A DEVICE THEREBY FORMED

CROSS-REFERENCE TO RELATED APPLICATION(S)

This application is a divisional patent application of co-pending U.S. patent application Ser. No. 09/627,352, now U.S. Pat. No. 6,368,954 entitled "METHOD OF COPPER INTERCONNECT FORMATION USING ATOMIC LAYER DEPOSITION," filed Jul. 28, 2000, by the same Applicants.

TECHNICAL FIELD

The present invention relates to methods of semiconductor fabrication. In particular, the present invention relates to methods of forming copper metallization structures.

BACKGROUND OF THE INVENTION

In the field of semiconductor fabrication techniques, an industry-wide transition from aluminum to copper interconnects is in progress. Currently, copper interconnects are formed using a so-called "damascene" or "dual-damascene" fabrication process. Briefly, a damascene metallization process forms conducting interconnects by the deposition of conducting metals in recesses formed on a semiconductor wafer surface. Typically, semiconductor devices (e.g., transistors) are formed on a semiconductor substrate. These devices are typically covered with an oxide layer. Material is removed from selected regions of the oxide layer creating openings in the semiconductor substrate surface. The openings correspond to a circuit interconnect pattern forming an "in-laid" circuit pattern. This creates a semiconductor substrate having an in-laid circuit pattern corresponding to a conductor wiring pattern. Once the in-laid patterns have been formed in the oxide layer a barrier layer is formed, upon which, a conducting "seed layer" is fabricated. Such seed layers are frequently constructed of copper. This so-called seed layer provides a conducting foundation for a subsequently formed bulk copper interconnect layer which is usually formed by electroplating. After the bulk copper has been deposited excess copper is removed using, for example, chemical-mechanical polishing. The surface is then cleaned and sealed with a sealing layer. Further processing may then be performed.

Currently, the barrier layer is deposited over an etched substrate using physical vapor deposition (PVD) or chemical vapor deposition (CVD) techniques. Commonly used barrier materials are tantalum nitride, tungsten nitride, titanium nitride or silicon compounds of those materials. Barrier layer deposition by PVD has the advantage of creating barrier layer films of high purity and uniform chemical composition. The drawback of PVD techniques is the difficulty in obtaining good step coverage (a layer which evenly covers the underlying substrate is said to have good step coverage). On the other hand, CVD techniques or metal organic chemical vapor deposition (MOCVD) techniques provide excellent step coverage, even in narrow trenches having high aspect ratios (aspect ratio is the ratio of trench depth to trench width). The trade off with CVD and MOCVD techniques is that these processes are "dirty" in comparison to PVD techniques. CVD and MOCVD incorporate large amounts of carbon and oxygen impurities into deposited films and are hence "dirty." These impurities reduce the adhesion of the barrier layer to the underlying substrate. Similarly, the impurities reduce the adhesion of a subsequently formed seed layer to the barrier layer. This results in reduced film quality, void creation, increased electromigration problems, and reduced circuit reliability. Thus, a process engineer is faced with a delicate balancing act when choosing a deposition technique to form barrier layers.

After barrier layer deposition, a seed layer of conducting material is deposited. Typically, this material is copper, but other conducting materials may be used. The seed layer provides a low resistance conduction path for a plating current used in the electro-deposition of a subsequent bulk copper interconnect layer. Additionally, the seed layer provides a nucleation layer for the initiation of the subsequent electroplating of the bulk copper interconnect layer. Copper is the preferred seed layer material not only because of its high conductivity, but because it is the ideal nucleation layer for the growth of the subsequently electro-deposited copper film. The seed layer carries electroplating current from the edge of the wafer to the center, allowing the plating current source to contact the wafer only near the edge. The thickness of the seed layer must be sufficient such that the voltage drop from wafer edge to wafer center does not negatively impact the uniformity of the plating process. Additionally, the seed layer carries current into the bottom of vias and trenches. The thickness of the seed layer must be sufficient such that any voltage drop does not significantly retard the plating process at the bottom of the via or the trench relative to the top.

As with the barrier layer, the copper seed layer may be deposited using PVD, CVD, or MOCVD techniques. Seed layer deposition suffers from the same limitations as barrier layer deposition. When using PVD, the uneven step coverage in the seed layer results in an excessively thick copper seed layer near the top of trench structures while trench sidewalls and bottoms have a relatively thinner coating of copper film. This results in a "pinching-off" of the bottom of the trench during subsequent plating steps, leading to the existence of large voids and poor quality interconnect and via structures.

As explained above, step coverage problems inherent in PVD processes maybe overcome using MOCVD or CVD techniques. MOCVD and CVD of copper are attractive because they are capable of depositing the seed layer at nearly 100 percent step coverage. This results in copper film of nearly uniform thickness throughout a wide range of surface conformations. As with the barrier layer, this advantage is especially useful in narrow trenches with high aspect ratios.

Unfortunately, when using a highly reactive substance such as copper, CVD and MOCVD become even "dirtier" processes. MOCVD and CVD processing environments are filled with impurities which readily react with copper. Extraneous materials, such as oxygen and carbon, are readily incorporated into the copper seed layer. This degrades the quality and reliability of the seed layer. The impurities reduce seed layer adhesion to the underlying barrier layer. Additionally, the impurities increase the resistivity of the copper seed layer and degrade the uniformity of the subsequently deposited bulk copper interconnect layer. The impurities also lead to poor bonding with the subsequently formed bulk copper interconnect layer.

In summary, existing processes of copper interconnect formation suffer from a number of drawbacks, including difficulties in forming seed and barrier layers in vias and trenches having high aspect ratios (i.e., deep trenches having narrow trench widths), poor step coverage (non-uniform surface coverage), and void formation in the barrier, seed, and bulk interconnect layers of the damascened process. Additionally, existing techniques exhibit poor adhesion between the barrier and seed layers leading to an increased incidence of void formation at the barrier layer/seed layer interface. This difficulty leads to increased incidence of electromigration and increased incidence of circuit unreliability. Additionally, existing processes are not easily extendible into smaller dimensions (i.e., below 0.1 $\mu$m). As a result, there is a need for an improved interconnect structure including improved barrier and seed layers as well as the method of forming these structures and layers.

Accordingly, there is a need for improved processes and semiconductor metallization structures that provide:

enhanced step coverage of the seed and barrier layers in deep sub-0.25-$\mu$m vias and trenches;

reduced incidence of void formation at via and trench sidewalls during subsequent bulk copper deposition;

enhanced adhesion between the layers of a barrier layer/ seed layer/bulk layer structure;

increased electromigration resistance in interconnect structures; and extension of the copper damascene process to extremely small dimensions beyond 0.1 $\mu$m in width or diameter.

SUMMARY OF THE INVENTION

Accordingly, the present invention discloses improved barrier and seed layers as well as methods for constructing them. The present invention also discloses an improved interconnect structure as well as a method for construction.

In accordance with the principles of the present invention, there is provided a new interconnect structure and the method of forming the interconnect structure. The present invention is an interconnect structure having a barrier layer formed over a patterned semiconductor substrate using atomic layer deposition; a pre-seed layer formed using atomic layer epitaxy; a thick seed layer; a bulk copper interconnect layer; and a top sealing layer. The method of the present invention comprises providing a semiconductor substrate having an in-laid circuit pattern on its surface corresponding to a conductor wiring pattern; depositing a layer of barrier material over said surface using atomic layer deposition; depositing a pre-seed layer of conducting material using atomic layer epitaxy; depositing a seed layer of conducting material; depositing a bulk interconnect layer; further processing which may include planarizing said interconnect layer and forming a top sealing layer.

Other features of the present invention are disclosed or apparent in the section entitled "DETAILED DESCRIPTION OF THE INVENTION."

BRIEF DESCRIPTION OF THE DRAWING

For fuller understanding of the present invention, reference is made to the accompanying drawings in the section headed Detailed Description of the Invention. Reference numbers refer to the same or equivalent parts of the present invention throughout the several figures of the Drawings.

DETAILED DESCRIPTION OF THE INVENTION

Figure 1:
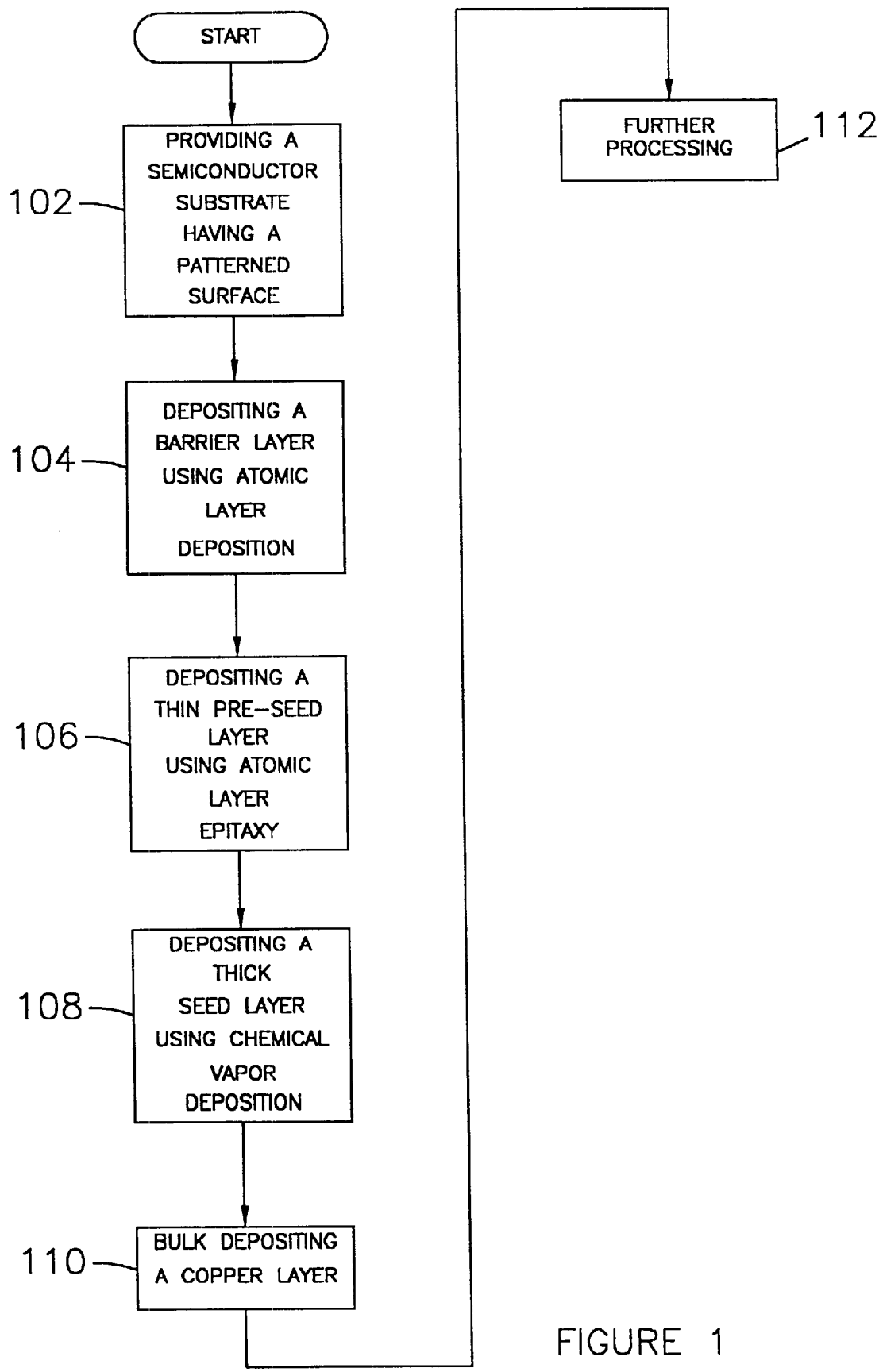
FIG. 1 is a flowchart depicting a method of copper interconnect formation, in accordance with the present invention.
Figure 2:
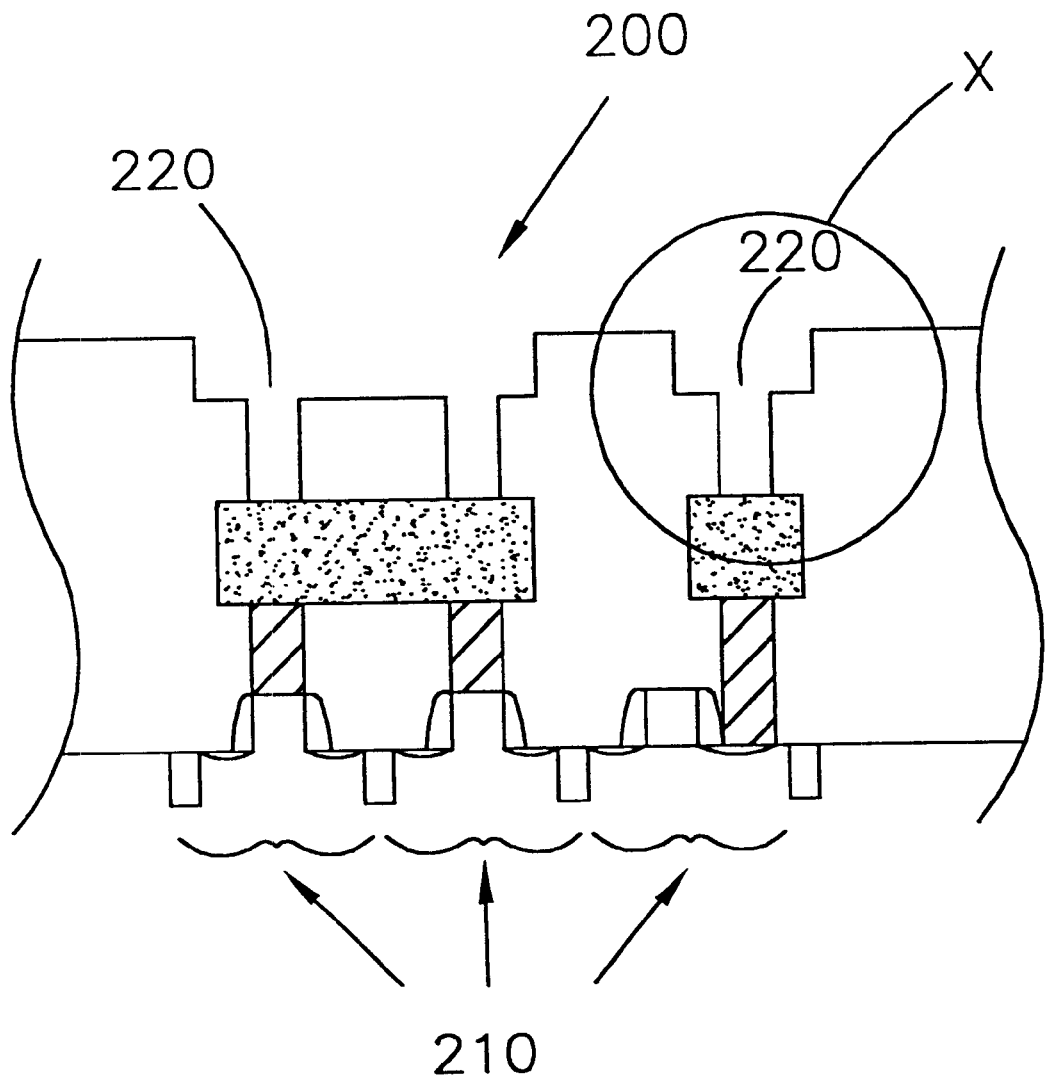
FIG. 2 is a cross section view of a semiconductor substrate patterned in readiness, in accordance with the present invention.
Figure 3:
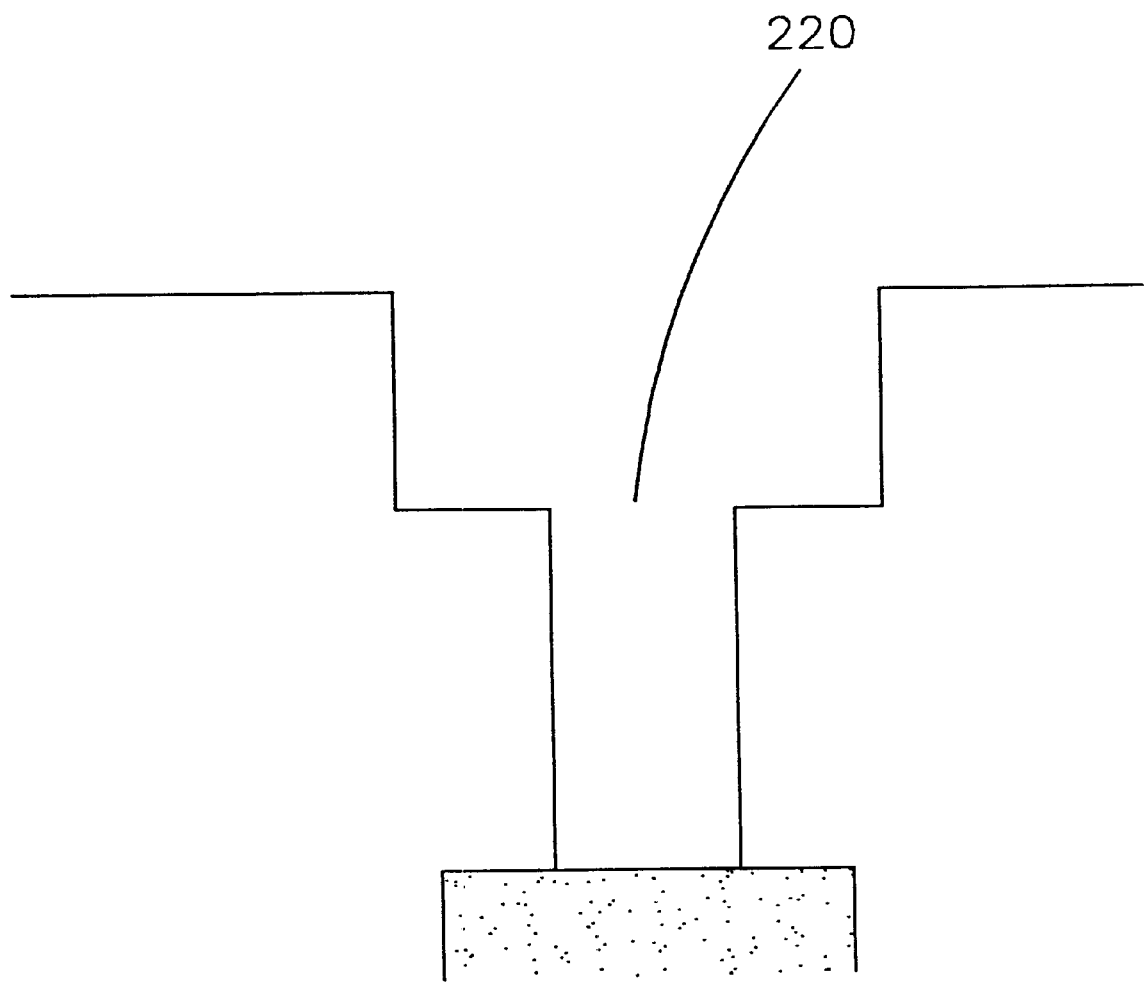
FIG. 3 is a magnified view of the semiconductor substrate of FIG. 2, in accordance with the present invention.

A flowchart showing a method of metal interconnect formation in accordance with the principles of the present invention is depicted in FIG. 1. The process begins in Step 102 in which there is provided a semiconductor substrate patterned in readiness for the deposition of a conducting interconnect. The pattern applied to the semiconductor substrate is an in-laid circuit pattern corresponding to a conductor wiring pattern. An exemplar of such a substrate is shown in FIG. 2. FIG. 2 depicts a cross-section view of a semiconductor wafer 200 having circuit elements 210 and "in-laid" regions 220 (the in-laid regions 220 are interchangeably referred to herein as in-laid regions, portions, and in-laid surfaces) where material has been removed from the surface of the wafer 200 to allow the deposition of conducting material to interconnect circuit elements 210. The area "X" is an in-laid portion 220 of the wafer 200. Area "X" is depicted in FIG. 3. Methods of constructing such substrates are known to those having ordinary skill in the art.

Figure 4:
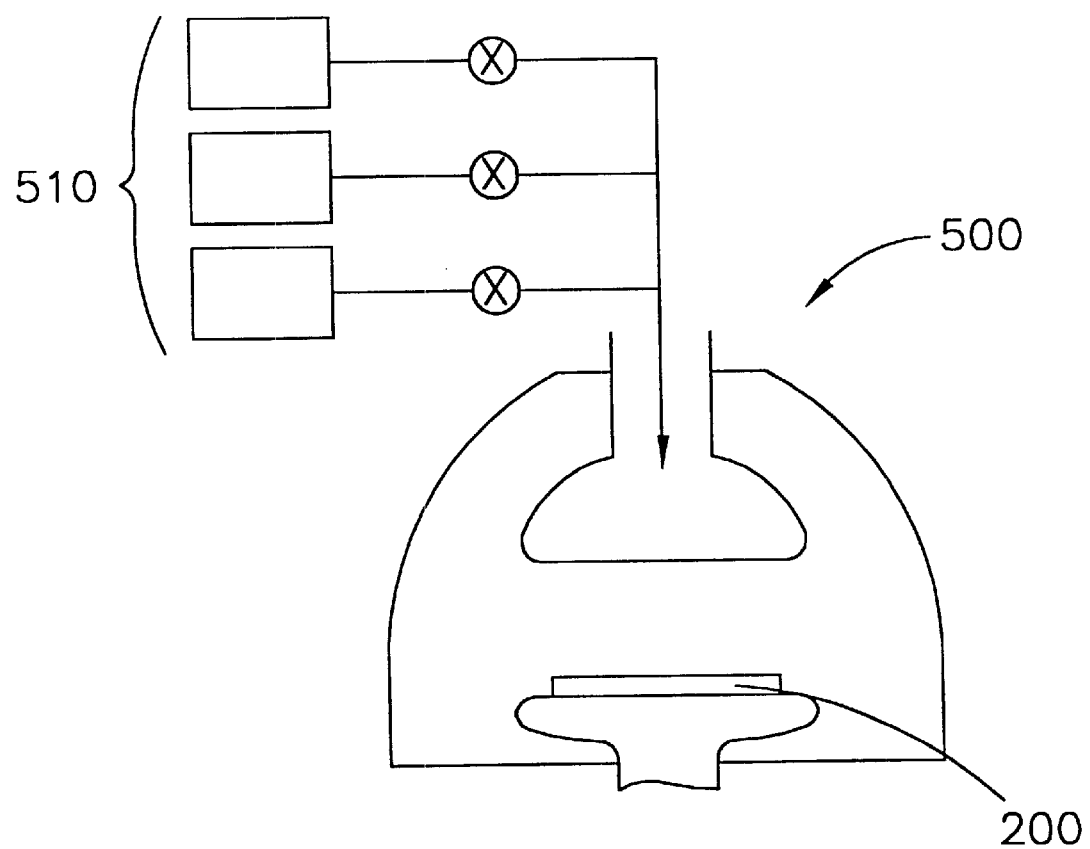
FIG. 4 is a schematic representation of the semiconductor substrate of FIG. 2 inside a typical process apparatus, in accordance with the present invention.
Figures 5, 6:
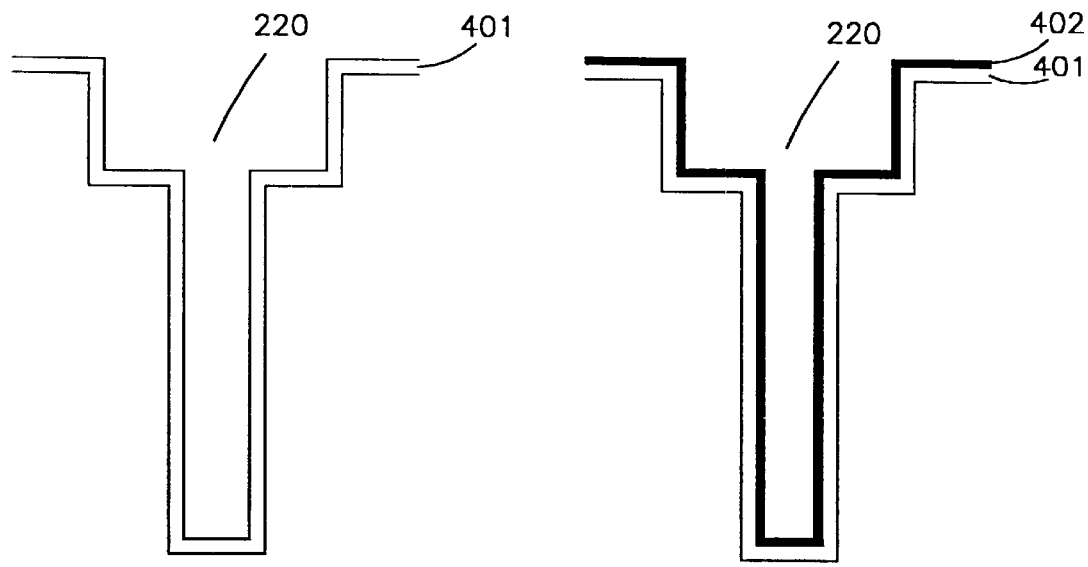
FIG. 5 is the semiconductor substrate of FIG. 3 after barrier layer formation using atomic layer deposition techniques, in accordance with the present invention.
FIG. 6 is the semiconductor substrate of FIG. 4 after formation of a pre-seed layer using atomic layer epitaxy techniques, in accordance with the present invention.

Referring to FIG. 1, FIG. 4, and FIG. 5, in Step 104, a barrier layer 401 is formed on the in-laid surface 220. A thin barrier layer is formed using atomic layer deposition (ALD). Typically, the ALD process is performed using a Chemical Vapor Deposition (CVD) process tool 500, for example, a CVD reactor manufactured by Genus, Inc. of Sunnyvale, Calif.

Referring to FIG. 4, in applying the barrier layer 401 according to the invention, the entire wafer 200 is placed in a process tool 500, for example, a CVD machine. Gas reactants (also known as precursors) are introduced to a vacuum chamber of the process tool 500.

The ALD process is carried out in a vacuum chamber at a pressure in the range of about 1–50 mTorr and at a temperature in the range of about 100° C.–400° C., and preferably 300° C.–400° C. The primary feature of the ALD process is the formation of the barrier layer 401 by a multiplicity of process cycles in which each cycle produces essentially an equivalent monolayer of the barrier material. The number of cycles used depends on the thickness desired but generally exceeds 1,000 cycles. For example, 1,200 cycles form a coating of approximately 40 nanometers thick. A typical process of forming the barrier layer 401 is illustrated as follows.

A semiconductor wafer 200 having an in-laid current pattern corresponding to a conductor wiring pattern is loaded into a process chamber of the process tool 500 and the chamber is heated to a temperature of approximately 160–400° C. The chamber is purged with nitrogen ($N_2$) gas for a period of several minutes to an hour, for example, 1,000 seconds. Once the chamber is evacuated, the precursors are introduced into the chamber of the process tool 500. In the specific example described here, the barrier layer 401 is formed of titanium nitride (TiN) and the precursor gases are titanium chloride ($TiCl_4$) and ammonia ($NH_3$). The precursors are introduced alternately during each cycle of the process so that each process cycle results in an equivalent atomic layer of the $TiCl_4$ deposited on all surfaces in the chamber. The $TiCl_4$ source is then turned off and the system is purged with $N_2$ to flush all unreacted $TiCl_4$ from the reaction chamber. Thereafter, $NH_3$ is introduced to convert the deposited $TiCl_4$ compound to TiN. This is followed by an $N_2$ purge. For example, the $TiCl_4$ is introduced at a flow rate of about 2 SCCM for about 15 seconds, followed by a nitrogen purge at about 90 SCCM for 30 seconds, and then $NH_3$ at a flow rate of about 25 SCCM for about 20 seconds, followed by a nitrogen purge at about 90 SCCM for six seconds. This procedure is continued for the desired number of cycles. Typically, pressures ranging from about 1–30 mTorr are suitable for these processes. A satisfactory pressure is about 3 mTorr. Further details of the process and the specific processing parameters for alternative materials are given by T. Suntola in "Materials Science Reports," Vol. 4, No. 7, pp. 26–312, December 1989, and U.S. Pat. No. 4,058,430, both of which are incorporated herein by reference.

Typically, the barrier layer 401 is formed using tantalum (Ta). Satisfactory compounds used to fabricate the barrier layer 401 also include, but are not limited to, titanium nitride (TiN), tungsten nitride (WN), tantalum nitride (TaN), tantalum (Ta), or the silicide compounds thereof (e.g., TiSiN, WSiN, or TaSiN). Barrier layers 401, may be formed using WN. Such WN layers may be formed using the following precursor materials: $WF_6$ and $NH_3$ or $W(CO)_3$ and $NH_3$. For a TaN barrier layer 401, $TaCl_5$ and $NH_3$ are used as precursors.

The barrier layer 401 is ALD deposited to a thickness in the range of about 20–300 Å. For example, a preferred embodiment uses a WN barrier layer 401 deposited to a thickness of approximately 70 Å. After ALD of the barrier layer 401, the barrier layer precursors are evacuated from the CVD process tool 500. The ALD barrier layer 401 exhibits excellent step coverage being very conformal to the surface topography. Additionally, the ALD barrier layer 401 exhibits excellent adhesion characteristics with the underlying substrate (which is typically a dielectric material having a low dielectric constant).

With reference to FIGS. 1, 4, and 6, a pre-seed layer 402 comprised of conducting material is formed over said barrier layer 401 in Step 106. The pre-seed layer 402 is formed using atomic layer epitaxy (ALE). The pre-seed layer 402 is formed without removing the wafer 200 from the CVD tool process 500. The details of a satisfactory atomic layer epitaxy process are outlined in the article "Atomic Layer Epitaxy of Copper," Journal of Electrochemical Society, Vol. 145, N8, p. 2929, 1998, P. Martensson & J-O. Carlsson, which is incorporated by reference herein.

The ALE process is carried out at a pressure in the range of 5–10 Torr and at a temperature in the range of 150–400° C. and preferably in the range of 150–250° C. As disclosed above, the primary feature of atomic layer epitaxy or deposition processes is the formation of layers by a multiplicity of process cycles in which each cycle produces an essentially equivalent monolayer of the appropriate film. As is known in the art, a cycle is considered to be all steps required to produce said equivalent monolayer. The number of cycles used depends on the thickness desired. A typical process of forming the ALE pre-seed layer of Step 106 is described, infra.

The wafer 200 remains in the process chamber after the barrier layer 401 is formed. The chamber of the process tool 500 is then heated to approximately 150–250° C. The chamber is then purged with $N_2$ for a period of several minutes to an hour. After the purge, pre-seed layer precursors are introduced into the chamber. A typical pre-seed layer 402 is formed of copper (Cu). Preferred ALE precursors are Cu(II)β-diketonates, such as Cu(II)-2,2,6,6,-tetramethyl-3,5-heptanedionate ($Cu(thd)_2$) and Cu(II)-1,1,1, 5,5,5-hexafluro-2,4-pentanedionate ($Cu(hfac)_2$).

The ALE process continues until a copper pre-seed layer 402 of between 1.5–10 Å is formed. A preferred thickness being about 5 Å. The pre-seed layer 402 is largely crystalline and forms an excellent underlayer for the subsequent formation of thicker copper layers. Additionally, the ALE Cu pre-seed layer 402 demonstrates good crystallographic ordering at the ALD/ALE interface. Excellent bond alignment exists between the barrier layer 401 and the pre-seed layer 402. The interface between the ALD barrier layer 401 and the ALE pre-seed layer 402 is not contaminated by a native oxide and is a heteroepitaxial interface. A heteroepitaxial interface is an interface between two different materials (e.g., Ta and Cu) having atomic matching at the interface. The advantages of such heteroepitaxial interfaces are: (1) a reduction in the number of defects in the interface, thereby reducing the number of void nucleation sites; (2) a reduction in interface diffusion; (3) an enhancement of the crystalline <111> Cu structure, a factor which improves resistance to electromigration. Thus, the interface between the ALD barrier layer 401 and the ALE pre-seed layer 402 is largely defect-free. This leads to surprisingly strong adhesion between the barrier layer 401 and pre-seed layer 402, resulting in a reduced incidence of voiding and increased resistance to electromigration.

Figures 7, 8:
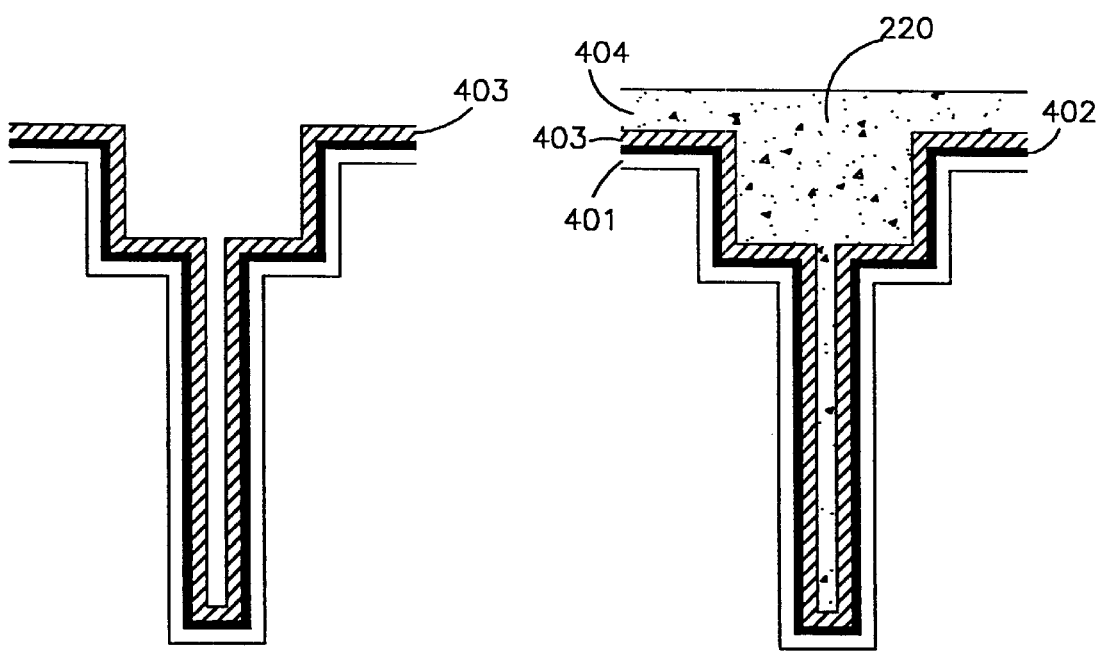
FIG. 7 is the semiconductor substrate of FIG. 6 after depositing a seed layer, in accordance with the present invention.
FIG. 8 is the semiconductor substrate of FIG. 7 after formation of a bulk interconnect layer, in accordance with the present invention.

Referring to FIGS. 1, 4, and 7, in Step 108 a seed layer 403 is deposited using CVD or MOCVD techniques. Again, this step may be performed without removing the wafer 200 from the CVD process tool 500. The seed layer 403 is formed of conducting material, preferably Cu. To achieve the deposition of Cu CVD precursors, for example Cu(I)β-ketonates, are used being a preferred precursor being Cu(I)-trimethylvinylsilyl hexafluoroacetylacetonate (Cu (hfac) (tmvs)). Due to the already highly ordered nature of the pre-seed layer 402, the seed layer 403 forms homoepitaxially without interfacial changes. The pre-seed layer 402 and the seed layer 403 having exact atomic matching at the interface between the two layers 402, 403. This leaves the pre-seed layer 402/seed layer 403 interface largely defect-free. As a result, good adhesion exists between the pre-seed layer 402 and seed layer 403 creating a strong bond at the interface between these two layers 402, 403, leading to less voiding and higher reliability. The seed layer 403 is typically quite thick relative to the pre-seed layer 402, being deposited to a thickness of between about 50–2000 Å thick. In very narrow trenches, this thick Cu seed layer 403 may serve to form the final copper interconnect layer, requiring no further Cu deposition. However, in most applications a thicker bulk copper interconnect layer 404 is subsequently deposited to complete interconnect structures.

Referring to FIGS. 1, 4, and 8, a bulk deposition of copper is performed in Step 110. Typically, a bulk copper interconnect layer 404 is formed, either by CVD or electroplating (EP). If the interconnect layer 404 is formed using CVD techniques, the wafer 200 need not be removed from the CVD process tool 500. Typically, this interconnect layer 404 is formed until the inlaid region 220 is filled with interconnect material.

Figure 9:
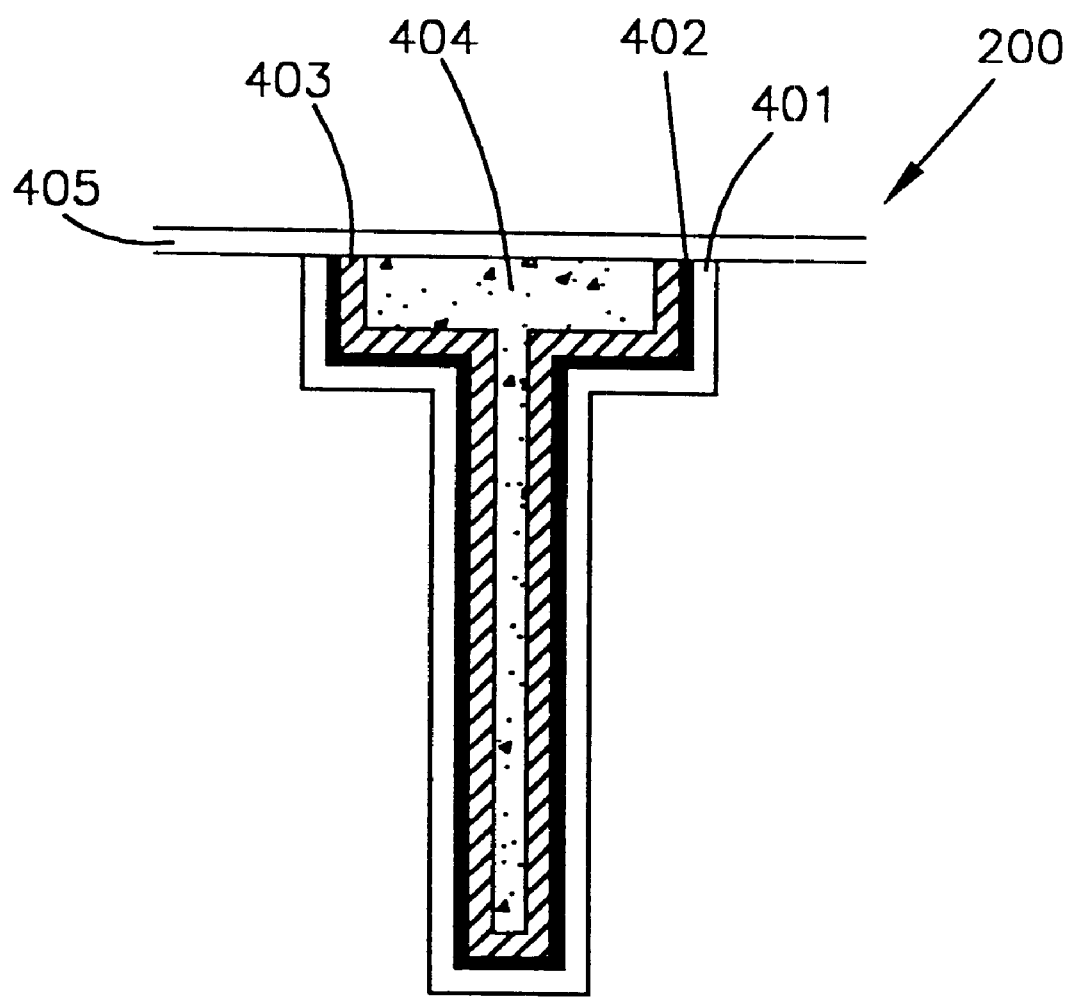
FIG. 9 is the semiconductor substrate of FIG. 8 after formation of a completed interconnect structure, in accordance with the present invention.

Referring to FIGS. 1 and 9, after bulk copper deposition the wafer 200 is typically subjected to further processing (as in Step 112). For example, excess copper of the interconnect layer 404 may be removed, typically using chemical mechanical polishing (CMP) to remove the topmost regions of the interconnect layer 404. Typically, this is followed by the formation of a top sealing layer 405. The top sealing layer 405 is typically formed of a material having high resistance to Cu diffusion to prevent the Cu from "poisoning" the wafer 200. A typical material is, for example, $Si_3N_4$. In fact, the same materials used in the formation of the barrier layer 401 may be used to form the top sealing layer 405 if selectively deposited on Cu line surfaces. Additionally, other structures may be subsequently formed atop the substrate 200 after the interconnect is completed, for example, forming multi-level circuit structures. A further advantage of the method of the present invention is that it is extendible to extremely small geometries (e.g., less than 0.1 $\mu$m) with high aspect ratios. A further advantage is that the method of the present invention can be accomplished in a single chamber of a CVD process tool 500.

Further, the barrier layer 401, pre-seed layer 402, and seed layer 403 provide a novel underlayer upon which high quality interconnect layers 404 may be fabricated. Additionally, the barrier layer 401, pre-seed layer 402, seed layer 403, bulk interconnect layer 404, and sealing layer 405, together, form a structure which demonstrates low incidence of voiding, high electromigration resistance, and high reliability.

It will be appreciated that many modifications can be made to the embodiments described above without departing from the spirit and scope of the invention. In particular, it should be noted that, the barrier layer 401 may formed of a wide range of materials including but not limited to, titanium nitride (TiN), tungsten nitride (WN), tantalum nitride (TaN), tantalum (Ta), or silicide compounds thereof. Further, the copper pre-seed layer 402 may be formed using a wide range of precursor materials including but not limited to Cu(II)β-diketonates such as Cu(II)-2,2,6,6,-tetramethyl-3,5-heptanedionate or Cu(II)-1,1,1,5,5,5-hexafluro-2,4-pentanedionate. Still further, the copper seed layer 403 may be formed using a wide range of precursor materials including but not limited to Cu(I)β-ketonates such as Cu(I)-trimethylvinylsilyl hexafluoroacetylacetonate (Cu(hfac) (tmvs)).

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference. And are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail maybe made without departing from the spirit and scope of the inventions as set forth in the appended claims. No claim herein is to be construed under the provisions of 35 U.S.C. §112, sixth paragraph, unless the element is expressly recited using the phrase "means for."

We claim:

1. A semiconductor interconnect structure, comprising:

(a) a semiconductor substrate having an in-laid circuit pattern formed therein;

(b) a barrier layer formed over said semiconductor surface;

(c) a pre-seed layer formed over said barrier layer, defining a first interface between said pre-seed layer and said barrier layer; and (d) a seed layer formed over said pre-seed layer, defining a second interface between said seed layer and said pre-seed layer, wherein said first interface is heteroepitaxial.

2. An interconnect structure, as recited in claim 1, wherein said second interface is homoepitaxial.

3. An interconnect structure, as recited in claim 1, further comprising a sealing layer formed over said seed layer.

4. An interconnect structure, as recited in claim 1, further comprising:

(a) a bulk interconnect layer formed over said seed layer; and (b) a sealing layer formed over said bulk interconnect layer.

5. An interconnect structure, as recited in claim 2, wherein said barrier layer comprises a material selected from a group consisting essentially of TiN, WN, TaN, Ta, and their silicide compounds.

6. An interconnect structure, as recited in claim 2, wherein said barrier layer comprises a polycrystalline film.

7. An interconnect structure, as recited in claim 2, wherein said barrier layer comprises an amorphous film.

8. An interconnect structure, as recited in claim 2, wherein said pre-seed layer comprises a highly conductive material.

9. An interconnect structure, as recited in claim 2, wherein said pre-seed layer comprises copper.

10. An interconnect structure, as recited in claim 2, wherein said seed layer comprises a pure polycrystalline copper.

11. An interconnect structure, as recited in claim 6, wherein said pre-seed layer strongly adheres to said barrier layer, and wherein said pre-seed layer comprises a polycrystalline copper film.

12. An interconnect structure, as recited in claim 6, wherein said first interface and said second interface are largely defect-free.

13. An interconnect structure, as recited in claim 11, wherein said seed layer strongly adheres to said pre-seed layer, and wherein said seed layer comprises a polycrystalline copper film.

* * * * *